(12) United States Patent
Kobayashi et al.

(10) Patent No.: US 11,517,982 B2
(45) Date of Patent: Dec. 6, 2022

(54) ELECTRONIC DEVICE AND METHOD FOR MANUFACTURING THE SAME

(71) Applicant: DENSO CORPORATION, Kariya (JP)

(72) Inventors: Wataru Kobayashi, Kariya (JP); Takumi Nomura, Kariya (JP); Yukinori Yamashita, Kariya (JP)

(73) Assignee: DENSO CORPORATION, Kariya (JP)

( * ) Notice: Subject to any disclaimer, the term of this patent is extended or adjusted under 35 U.S.C. 154(b) by 311 days.

(21) Appl. No.: 16/902,310

(22) Filed: Jun. 16, 2020

(65) Prior Publication Data

US 2020/0306888 A1    Oct. 1, 2020

Related U.S. Application Data

(63) Continuation of application No. PCT/JP2018/042357, filed on Nov. 15, 2018.

(30) Foreign Application Priority Data

Dec. 20, 2017   (JP) .............................. JP2017-244296

(51) Int. Cl.
*B23K 26/352* (2014.01)
*B23K 26/0622* (2014.01)
*B23K 26/00* (2014.01)
*H01L 23/31* (2006.01)
*H01L 23/495* (2006.01)
*H01L 23/00* (2006.01)
*B23K 103/08* (2006.01)

(52) U.S. Cl.
CPC ........ *B23K 26/355* (2018.08); *B23K 26/0006* (2013.01); *B23K 26/0622* (2015.10); *B23K 26/3584* (2018.08); *H01L 23/3107* (2013.01); *H01L 23/49513* (2013.01); *H01L 23/49548* (2013.01); *H01L 23/49582* (2013.01); *H01L 24/29* (2013.01); *H01L 24/32* (2013.01); *B23K 2103/08* (2018.08); *H01L 2224/29099* (2013.01); *H01L 2224/32245* (2013.01)

(58) Field of Classification Search
CPC .............. B23K 26/355; B23K 26/3584; H01L 2224/32245–3226; H01L 23/49513; H01L 2224/29015–29019
See application file for complete search history.

(56) References Cited

U.S. PATENT DOCUMENTS 9,517,532 B2   12/2016  Kobayashi et al.
2019/0237378 A1   8/2019  Kobayashi et al.

FOREIGN PATENT DOCUMENTS

JP   2018-182101 A   11/2018

*Primary Examiner* — Amar Movva
(74) *Attorney, Agent, or Firm* — Posz Law Group, PLC

(57) ABSTRACT

An electronic device includes a support member and a mount member mounting on the support member. The support member and the mount member are sealed by a resin member. The support member includes a surface having a laser irradiation mark. The mount member includes a surface having a rough portion with an accumulation of material of the support member.

7 Claims, 5 Drawing Sheets

ELECTRONIC DEVICE AND METHOD FOR MANUFACTURING THE SAME

CROSS REFERENCE TO RELATED APPLICATION

The present application is a continuation application of International Patent Application No. PCT/JP2018/042357 filed on Nov. 15, 2018, which designated the U.S. and claims the benefit of priority from Japanese Patent Application No. 2017-244296 filed on Dec. 20, 2017. The entire disclosures of all of the above applications are incorporated herein by reference.

TECHNICAL FIELD

The present disclosure relates to an electronic device and a method of manufacturing the electronic device.

BACKGROUND

In an electronic device, an electronic component may mount on a support member through solder or the like, and the support member and the electronic component may be sealed by resin. The electronic component may be, for example, an IC chip. The support member may be, for example, a lead frame. For maintaining the airtightness of a sealing body, the adhesion between the resin member and the other members may be enhanced. For example, the adhesion between the lead frame and the resin body may be enhanced by irradiating the lead frame with laser to roughen the lead frame before mounting the electronic component on the lead frame.

SUMMARY

The present disclosure describes an electronic device having a support member and a mount member mounting on the support member, and a method of manufacturing the electronic device.

DETAILED DESCRIPTION

In an electronic device, a further improvement in the bonding between a resin member and other members, for example, solder, an electronic component and wire, mounting on a support member may be needed.

In one or more embodiments of the present disclosure, an electronic device having enhanced adhesion between a mount member and a resin member and a manufacturing method for manufacturing the electronic device are provided.

The first aspect of the present disclosure is related to an electronic device including a support member and a mount member mounting on the support member. The support member and the mount member are sealed by a resin member. In the electronic device, the surface of the support member has a laser irradiation mark and a rough portion on which the material of the support member accumulates.

When the electronic device is manufactured, the support member is irradiated with the laser after mounting the mount member on the support member. Therefore, it is possible to enhance the adhesion between the mount member and the resin member with the rough portion.

The second aspect of the present disclosure is related to a method for manufacturing an electronic device having a support member and a mount member mounting on the support member. The support member and the mount member are sealed by a resin member. The method includes: mounting the mount member on a surface of the support member; forming a rough portion at a surface of the mount member by irradiating a target material with laser to scatter the material of the target material and accumulate the scattered material at the surface of the mount member, after mounting the mount member on the surface of the support member; and sealing the support member and the mount member by the resin member, after forming the rough portion. The target material includes a surface layer portion having a metal.

When the target material is irradiated with the laser after mounting the mount member on the support member, the material of the target material scattered by laser irradiation accumulates at the mount member and the rough portion is formed at the surface of the mount member. It is possible to enhance the adhesion between the mount member and the resin member through the rough portion.

The following describes one or more embodiments of the present disclosure with reference to the drawings. In the following respective embodiments, parts identical with or equivalent to each other are denoted by the same symbols for description.

First Embodiment

Figure 1:
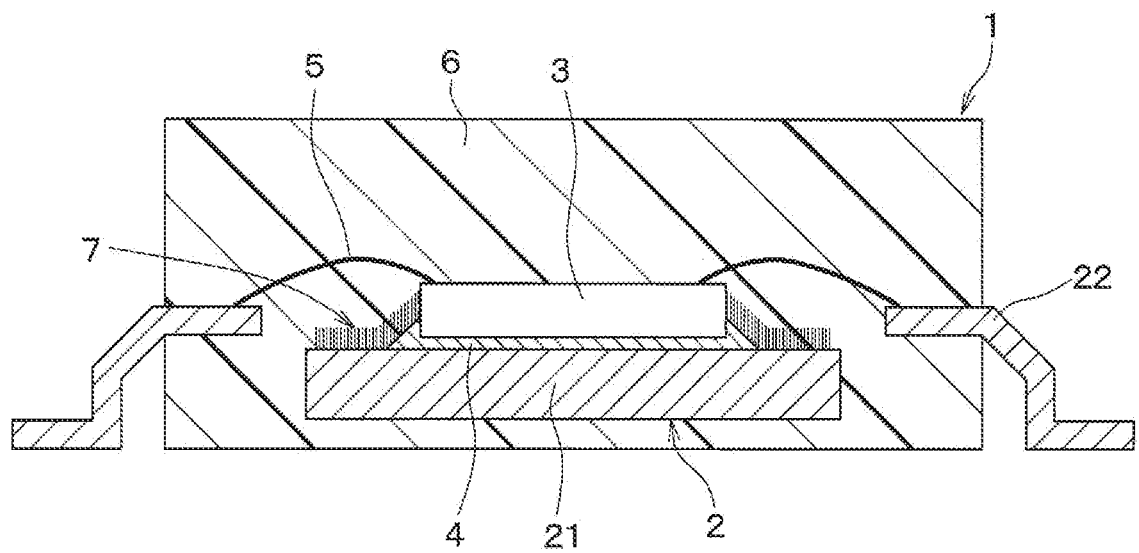
FIG. 1 is a cross-sectional view of an electronic device according to a first embodiment.

The following describes a first embodiment. As illustrated in FIG. 1, an electronic device 1 according to the present embodiment includes a support member 2, an electronic component 3, a bonding layer 4 as a mount member mounting on the support member 2, a bonding wire 5 and a resin member 6. For simplification of illustration and description, a graphic indication and presentation of detailed features such as a protective film, wiring, and the like with which the electronic device 1 is commonly provided are omitted in each drawing.

The support member 2 is a member that supports the electronic component 3. The support member 2 is a lead frame in which nickel, tin, aluminum, iron or the like is plated on a substrate made of copper, copper alloy, 42 alloy or the like. The lead frame includes a plate-formed island 21 and a lead 22. The support member 2 is bonded to the electronic component 3 at the island 21. The electronic component 3 may be a rectangular plate-formed IC chip.

The bonding layer 4 bonds the support member 2 and the electronic component 3. The bonding layer 4 has solder. A fillet is formed at the outer periphery of the bonding layer 4.

The electronic component 3 is fixed to the surface of the island 21 through the bonding layer 4. The electronic component 3 is connected to the lead 22 through the bonding wire 5 made of, for example, aluminum, gold, or copper.

The resin member 6 is a synthetic resin molded article and made of a thermosetting or thermoplastic synthetic resin such as epoxy resin, polyamide resin, polyphenylene sulfide resin, polybutylene terephthalate resin, and the like. The island 21, a portion of the lead 22, the electronic component 3, the bonding layer 4 and the bonding wire 5 are sealed by the resin member 6.

Figure 2:
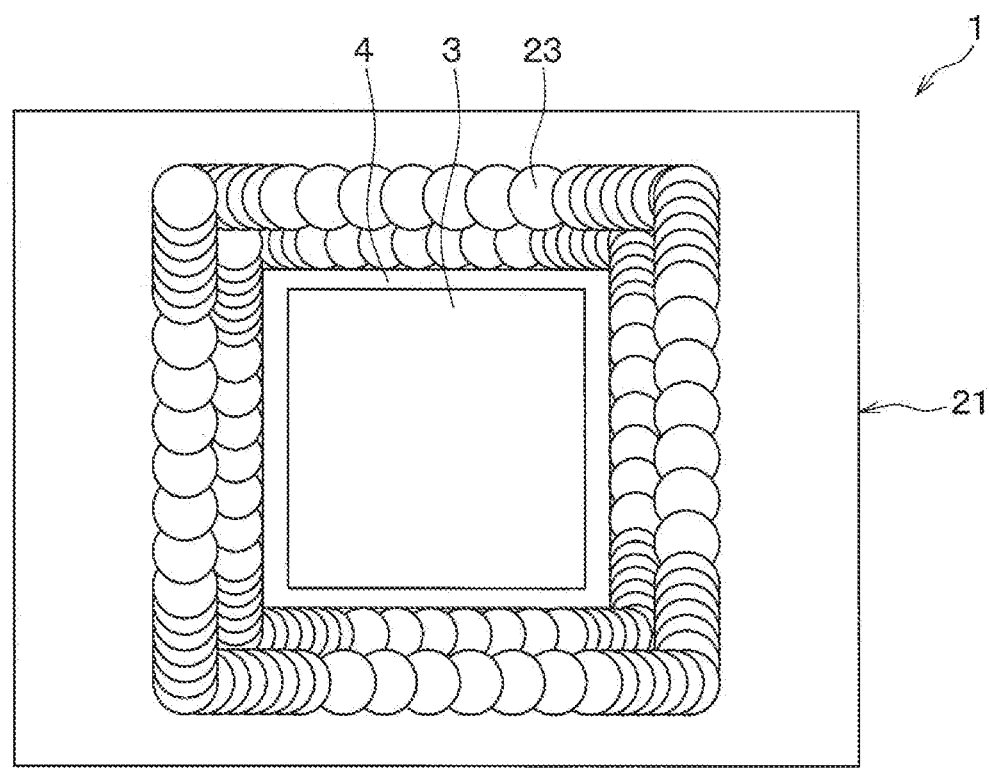
FIG. 2 is a plan view of the electronic device according to the first embodiment.

As illustrated in FIG. 2, laser irradiation marks 23 are formed at the upper surface of the island 21 through laser irradiation. In FIG. 2, the illustration of the lead 22, the bonding wire 5, the resin member 6 and a rough portion 7 are omitted. The rough portion 7 may also be referred to as an uneven portion having recession and protrusion.

The laser irradiation marks 23 are crater-like recessions and protrusions with an outer diameter of 5 μm to 300 μm, and are formed by irradiating the upper surface of the island 21 with a pulsed laser beam. One laser irradiation mark 23 having a substantially circular shape corresponds to one emission of a pulsed laser beam.

As illustrated in FIG. 1, the rough portion 7 is formed at the surface of the island 21 and the surface of the bonding layer 4. The rough portion 7 is formed by the accumulation of the material of the island 21 scattered by the laser irradiation. For example, when the surface layer of the island 21 is formed by nickel, the rough portion 7 formed by nickel is formed at the surface of the island 21 and the surface of the bonding layer 4. The protrusion and recession at the rough portion 7 are smaller than the protrusion and recession at the laser irradiation mark 23. In particular, the height of the protrusion and recession at the rough portion 7 is, for example, within a range of 2 nm to 1 μm. In other words, the height may be 2 nm or longer and 1 μm or shorter.

As illustrated in FIG. 2, the electronic component 3 is bonded to a central portion of the island 21, and the laser irradiation mark 23 is formed around the electronic component 3 and the bonding layer 4. Multiple laser irradiation marks 23 are aligned in a rectangular shape along the electronic component 3 and the bonding layer 4. The corner parts of the rectangle has denser laser irradiation marks 23 than other parts of the rectangle.

Figure 3:
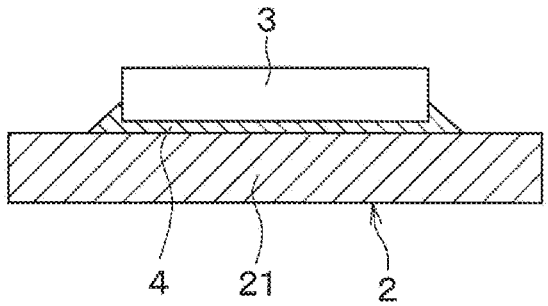
FIG. 3 is a cross-sectional view that illustrates a manufacturing step of the electronic device according to the first embodiment.

The following describes a manufacturing method of the electronic device 1. In a manufacturing step illustrated in FIG. 3, the support member 2 and the electronic component 3 are prepared. The bonding layer 4 is formed at the upper surface of the island 21 by coating or the like. The electronic component 3 is fixed to the island 21 by the bonding layer 4. The electronic component 3 and the lead 22 are connected by the bonding wire 5 by wire bonding. In FIG. 3, the illustration of the lead 22 and the bonding wire 5 is omitted.

Figure 4:
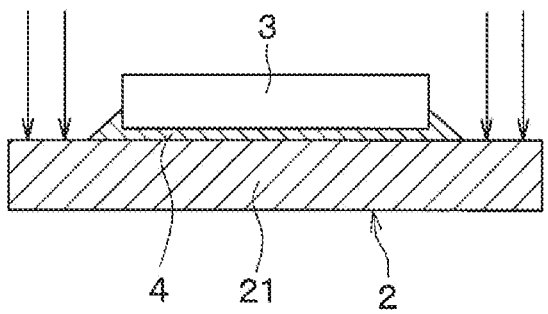
FIG. 4 is a cross-sectional view that illustrates a manufacturing step of the electronic device following the manufacturing step in FIG. 3.
Figure 5:
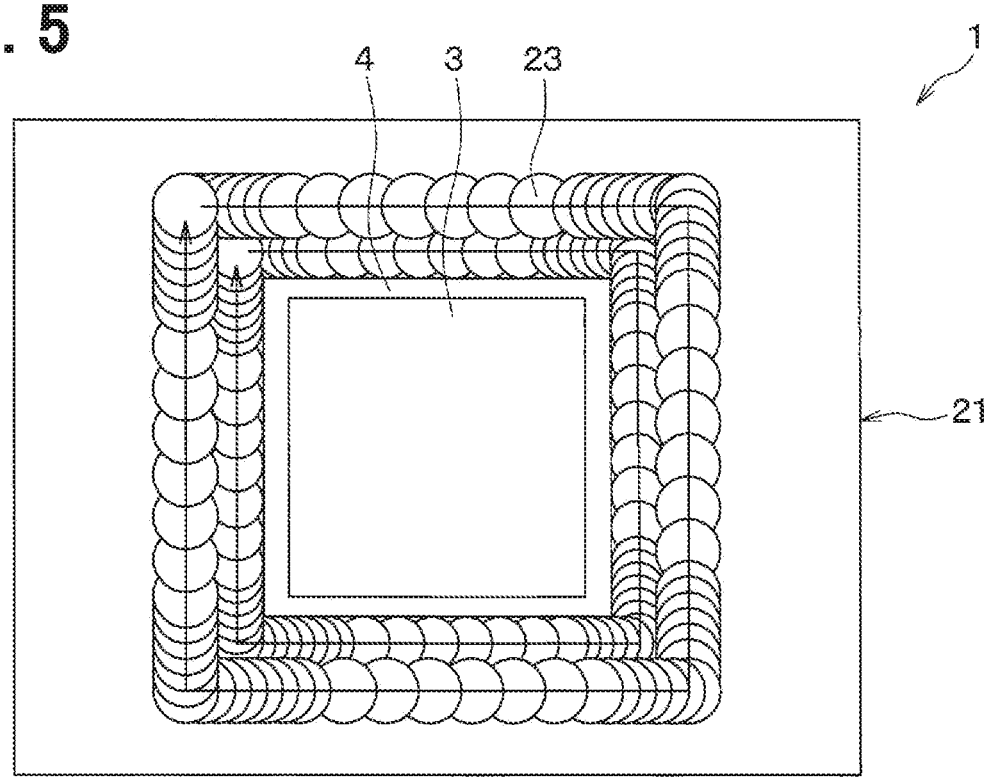
FIG. 5 is a plan view that illustrates a manufacturing step of the electronic device following the manufacturing step in FIG. 3.

In a manufacturing step illustrated in FIG. 4, as illustrated by an arrow, the upper surface of the island 21 as a target material is irradiated with laser in a normal direction of the upper surface. As illustrated by an arrow in FIG. 5, multiple laser irradiation marks 23 each having a substantially circular shape are formed by irradiating a pulsed laser beam multiple times while scanning the pulsed laser beam along the rectangle surrounding the electronic component 3 and the bonding layer 4. The laser irradiation is applied densely at the corner parts of the rectangle than at the other parts of the rectangle.

Figure 6:
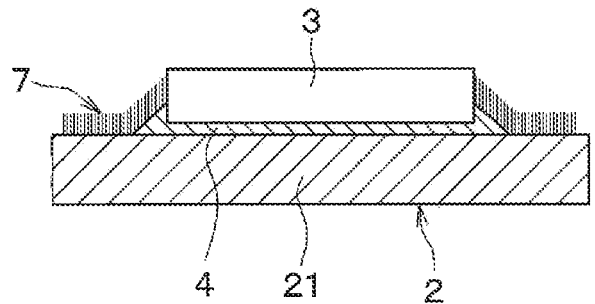
FIG. 6 is a cross-sectional view that illustrates a manufacturing step of the electronic device following the manufacturing step in FIGS. 4 and 5.

The material of the island 21 is scattered by evaporation, ablation or the like through the laser irradiation. The scattered material is deposited on the surface of the island 21 and the surface of the fillet portion of the bonding layer 4. As illustrated in FIG. 6, the rough portion 7 is formed at the surface of the island 21 and the surface of the bonding layer 4.

The island 21, the electronic component 3, the bonding layer 4, the bonding wire 5, and a portion of the lead 22 are sealed with the resin member 6 by adopting transfer molding or the like. The electronic device 1 illustrated in FIG. 1 is manufactured by performing tie-bar cut for separating the island 21 and the lead 22.

Protrusion and recession caused by the laser irradiation marks 23 are formed at the surface of the island 21, and the rough portion 7 is formed at the surface of the island 21 and the surface of the bonding layer 4. Therefore, the resin member 6 adheres with the island 21 and the bonding layer 4 through an anchor effect. The vicinity of a corner part of the electronic component 3 is a portion where internal stress such as thermal stress is easily generated and the resin member 6 is easily peeled off. However, the adhesion between the island 21 and the resin member 6 at this portion may be further enhanced by the laser irradiation.

In the present embodiment, when the laser irradiation is applied at the island 21 after the formation of the bonding layer 4 at the upper surface of the island 21, the scattered material of the island 21 caused by the laser irradiation accumulates at the bonding layer 4. The rough portion 7 is formed at the surface of the bonding layer 4. The adhesion between the bonding layer 4 and the resin member 6 is enhanced. It is possible to enhance the reliability of the electronic device 1 while suppressing the peeling of the resin member 6.

Second Embodiment

The following describes a second embodiment. The present embodiment differs from the first embodiment in a laser irradiation direction. The other parts in the present embodiment are similar to those of the first embodiment. Thus, the following only describes a part of the second embodiment different from the first embodiment.

Figure 7:
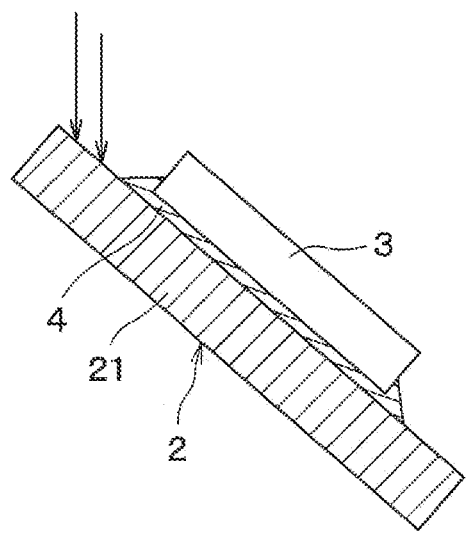
FIG. 7 is a cross-sectional view that illustrates a manufacturing step of an electronic device according to a second embodiment.

When the rough portion 7 is formed, the laser irradiation is applied in a direction tilted to the normal line of the upper surface of the support member 2. After the bonding layer 4 is formed at the island 21 and the electronic component 3 is fixed to the island 21, the island 21 is tilted to a horizontal plane and the laser irradiation is applied in a vertical direction from above, as illustrated in FIG. 7.

Figure 8:
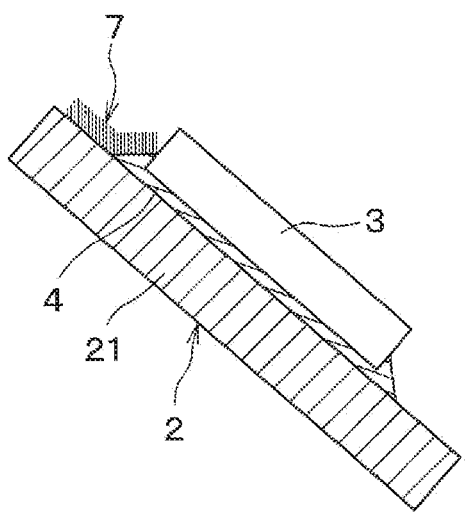
FIG. 8 is a cross-sectional view that illustrates a manufacturing step of the electronic device following the manufacturing step in FIG. 7.

When solder is adopted as the bonding layer 4, a fillet may be formed at the outer periphery of the bonding layer 4. It is possible to accumulate the material of the island 21 in a direction perpendicular to the surface of the fillet portion as illustrated in FIG. 8 by the laser irradiation. Therefore, it is possible to easily form the rough portion 7 at the fillet portion of the solder.

Third Embodiment

The following describes a third embodiment. The present embodiment differs from the first embodiment in a target irradiated with the laser. The other parts in the present embodiment are similar to those of the first embodiment. Thus, the following only describes a part of the third embodiment different from the first embodiment.

Figure 9:
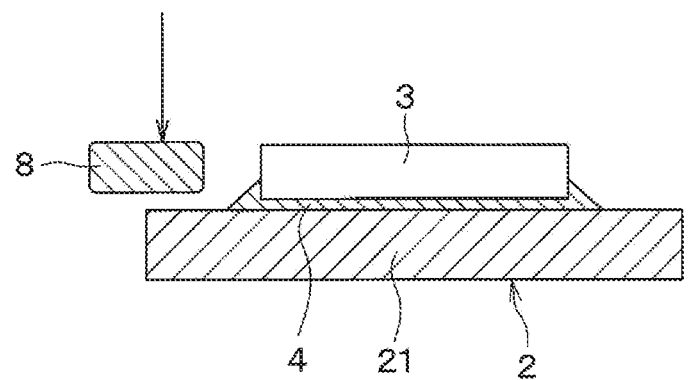
FIG. 9 is a cross-sectional view that illustrates a manufacturing step of an electronic device according to a third embodiment.

In the present embodiment, a member different from the support member 2 is irradiated with the laser. The bonding layer 4 is formed at the support member 2, and the electronic component 3 is fixed to the support member 2. Subsequently, as illustrated in FIG. 9, a target material 8 including at least a surface layer portion having a metal such as nickel is disposed near the bonding layer 4, and the target material 8 is irradiated with the laser. The scattered material of the target material 8 accumulates at the surface of the island 21 and the surface of the bonding layer 4, and the rough portion 7 is thus formed.

Even with this type of method, it is possible to enhance the adhesion between the resin member 6 and the island 21 and the adhesion between the resin member 6 and the bonding layer 4.

Other Embodiments

It should be noted that the present disclosure is not limited to the embodiments described above, and can be modified as appropriate. The above embodiments are not independent of each other, and can be appropriately combined except when the combination is obviously impossible. In each of the above embodiments, it is needless to say that the elements configuring the embodiments are not necessarily indispensable except when it is clearly indicated that the elements are particularly indispensable, when the elements are clearly considered to be indispensable in principle, and the like. In the above-described respective embodiments, when numerical values such as the number, figures, quantity, a range of configuration elements in the embodiments are described, the numerical values are not limited to a specific number, except when the elements are particularly specified as indispensable and the numerical values are obviously limited to the specific number in principle. Further, in each of the above-mentioned embodiments, when referring to the shape, positional relationship, and the like of a component and the like, the component is not limited to the shape, positional relationship, and the like, except for the case where the component is specifically specified, the case where the component is fundamentally limited to a specific shape, positional relationship, and the like.

Figure 10:
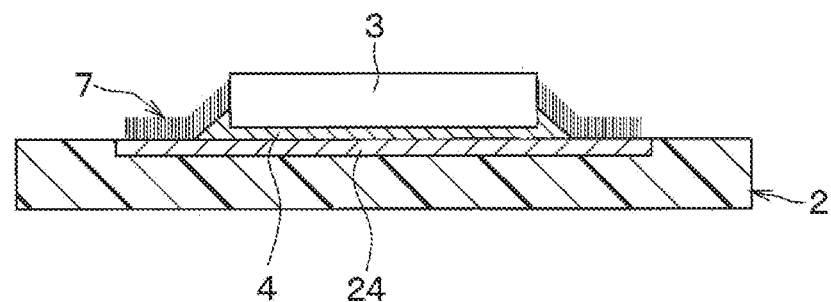
FIG. 10 is a cross-sectional view that illustrates an electronic device according to other embodiments.

For example, the support member 2 may be a lead frame whose surface layer portion and interior have nickel, aluminum, iron, or the like. The support member 2 may be a printed circuit board. As illustrated in FIG. 10, the electronic component 3 may mount on an electrode 24 included in the support member 2. In this situation, the electrode 24 is subjected to nickel plating or the like. The electronic component 3 is fixed to the electrode 24, and then the electrode 24 as the target material is irradiated with the laser. The rough portion 7 is formed at the surface of the electrode 24 and the surface of the bonding layer 4. Therefore, the adhesion between the bonding layer 4 and the resin member 6 is enhanced.

The electronic component 3 may be, for example, a chip capacitor and a chip resistor. The mount member mounting on the support member 2 may be a metal member such as a heat sink. The bonding layer 4 may be an adhesive such as a brazing material or a silver paste.

Figure 11:
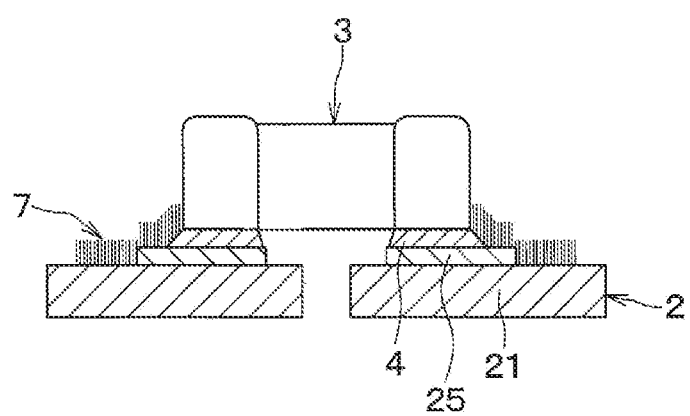
FIG. 11 is a cross-sectional view that illustrates an electronic device according to other embodiments.

In a situation where the electronic component 3 is a chip capacitor and the electronic component 3 mounts on an electrode 25 on the island 21 as illustrated in FIG. 11, the rough portion 7 is formed on the surface of the island 21, the surface of the electrode 25 and the surface of the bonding layer 4 by irradiating the island 21 with the laser after mounting the electronic component 3 on the electrode 25. Therefore, the adhesion between the resin member 6 and the island 21, the adhesion between the resin member 6 and the electrode 25 and the adhesion between the bonding layer 4 and the resin member 6 are enhanced.

In a situation where the electronic component 3 is a chip capacitor, it may be difficult to form the rough portion 7 at a location of the island 21 hidden by the electronic component 3 when the support member 2 is disposed on a horizontal plane and the laser irradiation is applied from above in the vertical direction. However, it is possible to further enhance the adhesion between the island 21 and the resin member 6 by easily forming the rough portion 7 at the hidden location of the island 21 through the adjustment of the direction of laser irradiation as described in the second embodiment.

The whole island 21 is sealed by the resin member 6 as illustrated in FIG. 1. However, the surface of the island 21 at a side opposite to the electronic component 3 may be exposed from the resin member 6. The electronic component 3 may be sandwiched between two support members 2.

Figure 12:
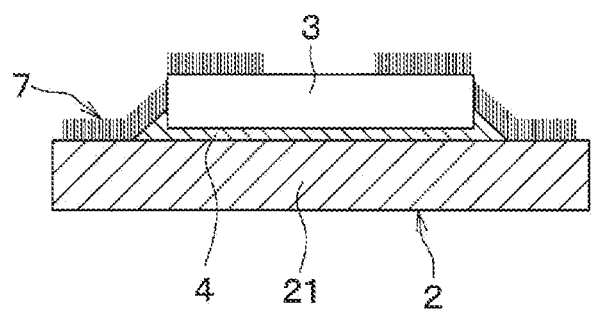
FIG. 12 is a cross-sectional view that illustrates an electronic device according to other embodiments.

The scattered material of the island 21 caused by the laser irradiation may accumulate on the electronic component 3 as the mount member, and the rough portion 7 may be formed at a portion of the surface of the electronic component 3 as illustrated in FIG. 12. The rough portion 7 may also be formed at the entire surface of the electronic component 3. Therefore, it is possible to enhance the adhesion between the electronic component 3 and the resin member 6.

The laser irradiation may only be applied to the location near the corner part of the electronic component 3, while the laser irradiation may not be applied to the other parts. It is possible to reduce the manufacturing cost while enhancing the adhesion at a location where the internal stress is easily generated. Additionally, the laser irradiation may also be entirely applied to a portion of the upper surface of the island 21 exposed from the bonding layer 4. In this situation, in consideration of the internal stress, the laser irradiation may be densely applied to the vicinity of the electronic component 3 as compared to other parts.

The electronic component 3 and the bonding layer 4 may be irradiated with a portion of the laser. The adhesion between the electronic component 3 and the resin member 6 is enhanced through the laser irradiation applied to the electronic component 3. However, it is possible to damage the electronic component 3 or change the property of the electronic component 3. Laser intensity, irradiation position or the like may be adjusted in consideration of the influence on the electronic component 3, when the electronic component 3 is irradiated with the laser.

Figure 13:
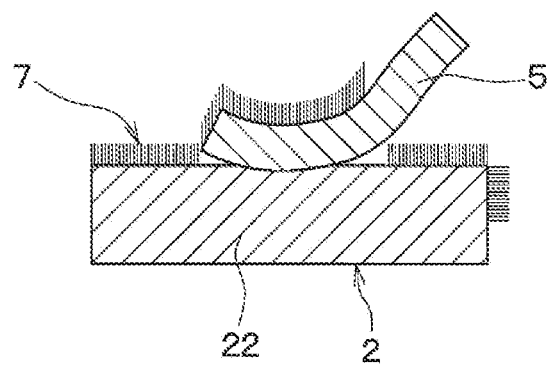
FIG. 13 is a cross-sectional view that illustrates a region near a lead of an electronic device according to other embodiments.

The rough portion 7 may be formed at the surface of the bonding wire 5 as the mount member mounting on the support member 2. As illustrated in FIG. 13, after the bonding wire 5 is connected to the lead 22, the lead 22 as the target material is irradiated with the laser. The scattered material of the lead 22 accumulates at the surface of the lead 22 and the surface of the bonding wire 5, and thus the rough portion 7 is formed. Therefore, it is possible to enhance the adhesion between the resin member 6 and the lead 22 and the adhesion between the bonding wire 5 and the resin member 6.

When the rough portion 7 is formed at the surface of the bonding wire 5, the bonding wire 5 may be irradiated with a portion of the laser. Although it is possible to further enhance the adhesion between the bonding wire 5 and the resin member 6, the bonding wire 5 may be disconnected when the bonding wire 5 made of a thin line is irradiated with the laser. Therefore, the laser intensity or the like may be adjusted in consideration of the influence on the bonding wire 5, when the bonding wire 5 is irradiated with the laser.

In a situation where the rough portion 7 is formed at the bonding wire 5, it may be difficult to form the rough portion 7 at a portion of the lead 22 hidden by the bonding wire 5, when the support member 2 is disposed on a horizontal plane and is irradiated with the laser from above in the vertical direction. When the direction of laser irradiation is adjusted as described in the second embodiment, it is possible to easily form the rough portion 7 at the portion of the lead 22 hidden by the bonding wire 5. Therefore, it is possible to further enhance the adhesion between the lead 22 and the resin member 6.

What is claimed is:

1. A method for manufacturing an electronic device including a support member and a mount member mounting on the support member, the support member and the mount member sealed by a resin member, the method comprising:
   mounting the mount member on a surface of the support member;
   forming a rough portion at a surface of the mount member by irradiating a target material with laser to scatter material of the target material and accumulate the scattered material at the surface of the mount member, after the mounting of the mount member on the surface of the support member; and
   sealing the support member and the mount member with the resin member, after the forming of the rough portion,
   wherein a surface layer portion of the target material includes a metal.

2. The method according to claim 1,
   wherein the target material is included in the support member.

3. The method according to claim 2,
   wherein the surface layer portion of the target material includes nickel.

4. The method according to claim 2,
   wherein the support member is a plate member, and
   wherein, in the forming of the rough portion, the laser irradiates in a direction tilted to a normal direction of an upper surface of the support member.

5. The method according to claim 1,
   wherein the target material is a member different from the support member.

6. The method according to claim 1,
   wherein the mount member includes a bonding layer having solder to bond the support member and other members.

7. A method for manufacturing an electronic device including a support member and a mount member mounting on the support member, the support member and mount member sealed by a resin member, the method comprising:
   mounting the mount member on a surface of the support member;
   irradiating a target material with laser to scatter material of the target material and accumulate the scattered material at the surface of the mount member;
   forming a rough portion at a surface of the mount member; and
   sealing the support member and the mount member with the resin member,
   wherein a surface layer portion of the target material includes a metal.

\* \* \* \* \*